(12) United States Patent
Kim et al.

(10) Patent No.: US 8,786,303 B2
(45) Date of Patent: Jul. 22, 2014

(54) SEMICONDUCTOR DEVICE HAVING A PLURALITY OF PADS

(75) Inventors: Kab Yong Kim, Suwon-si (KR); Hyun Soon Jang, Seoul (KR); Yong Hwan Jeong, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 958 days.

(21) Appl. No.: 12/858,673

(22) Filed: Aug. 18, 2010

(65) Prior Publication Data

US 2011/0043235 A1 Feb. 24, 2011

(30) Foreign Application Priority Data

Aug. 21, 2009 (KR) ........................ 10-2009-0077696

(51) Int. Cl.
*G01R 1/067* (2006.01)
*G01R 31/28* (2006.01)

(52) U.S. Cl.
CPC ........ *G01R 31/2891* (2013.01); *G01R 31/2884* (2013.01)
USPC .................................................. 324/755.11

(58) Field of Classification Search
CPC .. G01R 31/2891; G01R 1/067; G01R 31/275; G01R 31/26

USPC .................. 324/762.01–762.1, 764.01–754.3, 324/755.01–755.11; 257/48; 438/14–18
See application file for complete search history.

(56) References Cited

U.S. PATENT DOCUMENTS 7,026,833 B2 * 4/2006 Rincon et al. ............ 324/754.18
7,405,584 B2 * 7/2008 Fujita et al. .............. 324/750.28

FOREIGN PATENT DOCUMENTS

| JP | 10-223710 A | 8/1998 |
| JP | 2005-340696 A | 12/2005 |
| JP | 2008-071999 A | 3/2008 |

* cited by examiner

*Primary Examiner* — Tung X Nguyen
(74) *Attorney, Agent, or Firm* — Lee & Morse, P.C.

(57) ABSTRACT

A semiconductor device includes a plurality of sensor pads configured to receive a probe signal from a testing apparatus, and a plurality of normal pads configured to receive a driving signal to drive the semiconductor device. In the plurality of sensor pads and the plurality of normal pads, a length in a direction corresponding to one of progress directions of a plurality of needles of the testing apparatus is longer than a length in another progress direction of the plurality of needles.

13 Claims, 12 Drawing Sheets

PROGRESS DIRECTION OF NEEDLE

SEMICONDUCTOR DEVICE HAVING A PLURALITY OF PADS

BACKGROUND

1. Field

Embodiments relate to a semiconductor device, and more particularly, to a semiconductor device including a plurality of sensor pads and a plurality of normal pads for an electric die sort (EDS) test.

2. Description of the Related Art

An overall process of manufacturing a semiconductor device can include (1) a wafer manufacturing process, (2) a wafer EDS test process, and (3) a wafer packaging process. The EDS test process is a pre-process of the wafer packaging process, as described above, and during the EDS test the electrical characteristics of semiconductor chips on the wafer may be tested in a wafer state. For example, the EDS test may check whether data output after an electrical signal is applied to pads of a semiconductor device is normal. In particular, the electrical signal may be applied to the pads of the semiconductor device via needles, and data is output from the semiconductor device in response to the applied electrical signal.

To efficiently perform the EDS test on the wafer, each needle providing the electrical signal is preferably accurately aligned to a corresponding pad of the semiconductor device. As the capacity of semiconductor devices increases, however, the number of pads required for inputting/outputting an electrical signal remarkably increases. As such, it may be difficult for each needle to contact an accurate position on the corresponding pad of the semiconductor device. Moreover, when a needle fails to contact an accurate position on the corresponding pad, e.g., the needle may contact an edge portion of the pad, a serious quality defect may be generated. To address this issue, and to assist the needle in contacting an accurate position, a sensor pad may be used on the semiconductor device.

A single sensor pad, however, has limits in functionality. For example, even when a defect is detected in contacting a normal pad, the position of an applied electric signal on the sensor pad may inhibit the EDS test from detecting the defect.

The single sensor pad also has limits in checking the arrangement of needles when the semiconductor device includes pads arranged in various directions. For example, when the pads are arranged in a horizontal direction and a vertical direction, the needles may also be arranged in both the horizontal direction and the vertical direction. The single sensor pad, however, may only be able to check the arrangement of needles in one direction.

In the packaging process performed after the EDS test process, a probing mark generated on the pads due to the EDS test may be problematic. In particular, the probing mark signifies a mark generated as the needle contacts the corresponding pad during the EDS test. The probing mark, however, may affect the reliability of the semiconductor device, e.g., the probing mark may affect the reliability of a writing process in the packaging process.

SUMMARY

Embodiments are therefore directed to a semiconductor device including a plurality of sensor pads and a plurality of normal pads, which substantially overcome one or more of the problems due to the limitations and disadvantages of the related art.

It is therefore a feature of an embodiment to provide a semiconductor device including a plurality of sensor pads formed considering a progress direction of a needle, which may improve the efficiency of the EDS test and the reliability of the semiconductor device.

It is therefore another feature of an embodiment to provide a sensor pad having a longer length in a direction corresponding to one of progress directions of needles of the testing apparatus that is longer than a length in another progress direction of the plurality of needles.

It is therefore another feature of an embodiment to provide a normal pad having a longer length in a direction corresponding to one of progress directions of needles of the testing apparatus that is longer than a length in another progress direction of the plurality of needles.

At least one of the above and other features and advantages may be realized by providing a semiconductor device having a plurality of pads, which includes a plurality of sensor pads receiving a probe signal from a testing apparatus, and a plurality of normal pads receiving a driving signal to drive the semiconductor device. The plurality of sensor pads and the plurality of normal pads have a length in a direction corresponding to one of progress directions of a plurality of needles of the testing apparatus that is longer than a length in another progress direction of the plurality of needles.

At least one sensor pad of the plurality of sensor pads corresponds to a needle at an outermost side of a plurality of needles having a same progress direction. The plurality of sensor pads may include first sensor pads and second sensor pads.

The first sensor pads may have a length in a vertical direction of the semiconductor device that is longer than a length in a horizontal direction of the semiconductor device, the first sensor pads corresponding to needles having progress directions from a top or a bottom of the semiconductor device toward the vertical center of the semiconductor device. The second sensor pads may have a length in the horizontal direction of the semiconductor device that is longer than a length in the vertical direction of the semiconductor device, and the second sensor pads corresponding to needles having progress directions from a left or a right of the semiconductor device toward the horizontal center of the semiconductor device.

The first sensor pads may include at least one sensor pad corresponding to a needle at an outermost side of the plurality of needles having progress directions from the top of the semiconductor device toward the vertical center semiconductor device, and at least one sensor pad corresponding to a needle at an outermost side of the plurality of needles having progress directions from the bottom of the semiconductor device toward the vertical center of the semiconductor device. The second sensor pads may include at least one sensor pad corresponding to a needle at an outermost side of the plurality of needles having progress directions from the left of the semiconductor device toward the horizontal center of the semiconductor device, and at least one sensor pad corresponding to a needle at an outermost side of the plurality of needles having progress directions from the right of the semiconductor device toward the horizontal center of the semiconductor device.

The sensor pads may include an insulation portion arranged at a central portion of the sensor pad, and a conductive portion arranged at an edge portion of the sensor pad. The conductive portion may include a part of an area where a bump of a flip chip process is arranged. The insulation portion may include a central part of the area where the bump of the flip chip process is arranged, and the conductive portion may include an edge part of the area where the bump of the flip portion may include an edge part of the area where the bump of the flip chip process is arranged.

The semiconductor device may further include a needle alignment checking circuit capable of detecting a contact defect between the semiconductor device and the testing apparatus based on a result of a probe signal received via at least two sensor pads, and the needle alignment checking circuit outputs the contact defect to the testing apparatus via a corresponding one of the plurality of normal pads. The needle alignment checking circuit may include at least two probe blocks, each generating a probe result indicating the contact defect between the needles of the testing apparatus and the corresponding sensor pads, based on the probe signal received by the sensor pads via the needles of the testing apparatus, and an operation block capable of determining the contact defect between the semiconductor device and the testing apparatus based on a logical operation on the probe result received from each of the at least two probe blocks and outputting a determination to the corresponding normal pads.

At least one of the above and other features and advantages may also be realized by method of performing a needle alignment check on a wafer. The method may include providing a probe signal from a testing apparatus to a plurality of sensor pads on the wafer, and providing a signal for the testing apparatus to a plurality of normal pads on the wafer. The plurality of sensor pads and the plurality normal pads having a length in a direction corresponding to one of progress directions of the plurality of needles of the testing apparatus that is longer than a length in another progress direction of the plurality of needles.

The method may include detecting a contact defect between the wafer and the testing apparatus based on a result of a probe signal received via at least two sensor pads, and outputting the contact defect to the testing apparatus via a corresponding one of the plurality of normal pads. The method may further include generating a probe result indicating the contact defect between the needles of the testing apparatus and the corresponding sensor pads, based on the probe signal received by the sensor pads via the needles of the testing apparatus, and determining the contact defect between the wafer and the testing apparatus based on a logical operation on the probe result received from each of at least two probe blocks and outputting a determination to the corresponding normal pads.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION

Figure 1:
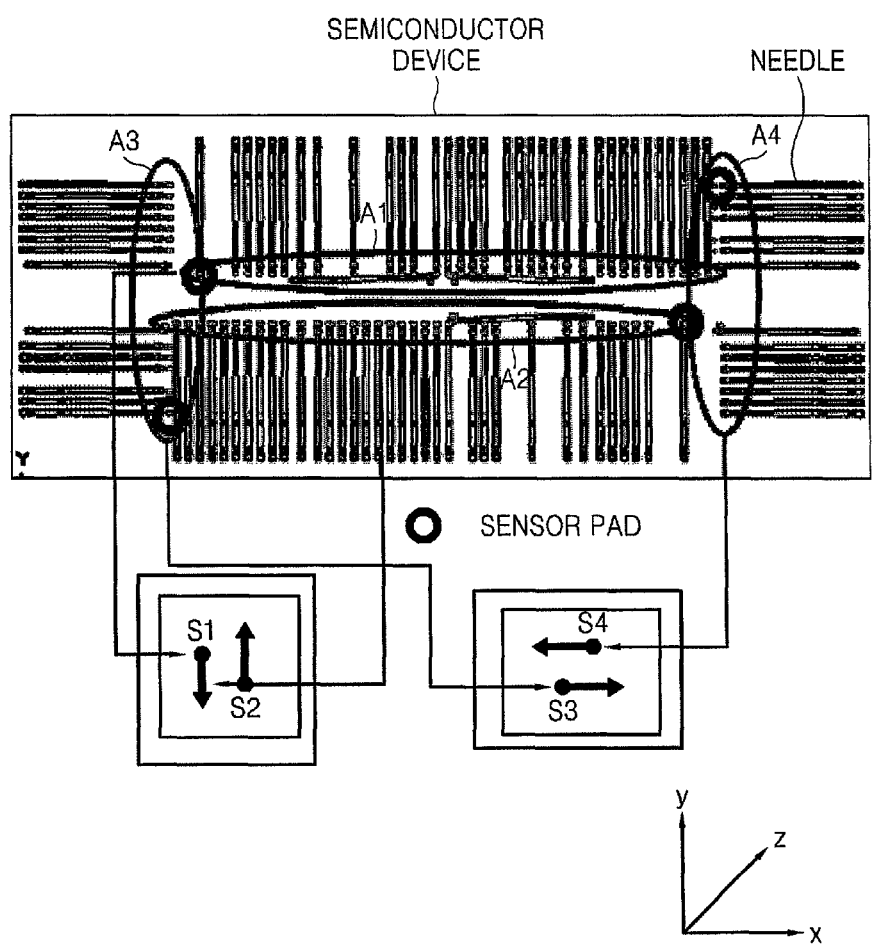
FIG. 1 illustrates a semiconductor device and needles of a testing apparatus contacting the semiconductor device, according to an exemplary embodiment.

Korean Patent Application No. 10-2009-0077696, filed on Aug. 21, 2009, in the Korean Intellectual Property Office, and entitled: "Semiconductor Device Having a Plurality of Pads," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

FIG. 1 illustrates a semiconductor device and needles of a testing apparatus contacting the semiconductor device, according to an exemplary embodiment. The pad arrangement of the semiconductor device shown in FIG. 1 may be interpreted as an H type pad arrangement, in which a plurality of pads are arranged in a horizontal direction and a vertical direction. Needles of the testing apparatus may be arranged to check the alignment of needles for an electric die sort (EDS) test of the semiconductor device.

The semiconductor device may include a plurality of sensor pads for receiving a probe signal via corresponding needles of the testing apparatus, and a plurality of normal pads (not shown) for receiving a driving signal for driving the semiconductor device. The plurality of sensor pads and normal pads contacting the corresponding needles may be arranged under the needles illustrated in FIG. 1.

In the sensor pads and the normal pads, a length in a direction corresponding to one of multiple progress directions of the plurality of needles of the testing apparatus may be longer than a length in another progress direction of the needles. For example, a sensor pad and/or a normal pad that contacts a needle progressing in the horizontal direction, e.g., along an x-axis as shown in FIG. 1, a length in the horizontal direction may be longer than a length in another progress direction, e.g., needles progressing in a vertical direction. A sensor pad and/or a normal pad that contacts a needle progressing in the vertical direction, e.g., along a y-axis as shown in FIG. 1, the length in the vertical direction may be longer than the length in another progress direction, e.g., needles progressing in the horizontal direction. Sensor pads and/or normal pads having longer lengths in the progress directions of corresponding needles may increase accuracy in the determination of contact between needles and corresponding pads.

Without intending to be bound by this theory, when the needle is able to contact the corresponding pad, the needle may slide in the progress direction after contacting the pad. When the pad has a length in the direction in which the corresponding needle progresses that is longer than a length in another progress direction, e.g., a progress direction of a needle that does not correspond to the pad, contact between the needle and the corresponding pad may be more accurately determined.

Referring to FIG. 1, the semiconductor device may include pad areas Area A1 and Area A2 arranged in the horizontal direction, e.g., along the x-axis, and pad areas Area A3 and Area A4 arranged in the vertical direction, e.g., along the y-axis. In an exemplary embodiment, the progress direction of the needles with respect to the pads in Area A1 may be along the y-axis from a top to a bottom, e.g., from the top toward the vertical center, of the semiconductor device shown in FIG. 1. The progress direction of the needles with respect to the pads in Area A2 may be along the y-axis from the bottom to the top, e.g., from the bottom toward the vertical center, of the semiconductor device shown in FIG. 1. The progress direction of the needles with respect to the pads in Area A3 may be along the x-axis from a left to a right, e.g., from the left toward the horizontal center, of the semiconductor apparatus shown in FIG. 1. The progress direction of the needles with respect to the pads in Area A4 may be along the x-axis from the right to the left, e.g., from the right toward the horizontal center, of the semiconductor device shown in FIG. 1.

The pads, e.g., the sensor pads and the normal pads, in Area A1 and Area A2 may have the length in the vertical direction, e.g., along the y-axis, that is longer than the length in the horizontal direction, e.g., along the x-axis, as shown in FIG. 1. The pads in Area A3 and Area A4 may have the length in the horizontal direction that is longer than the length in the vertical direction, as shown in FIG. 1.

The sensor pads of the semiconductor device arranged in the horizontal and vertical directions, e.g., as illustrated in FIG. 1, may include first sensor pads, e.g., S1 and S2, and second sensor pads, e.g., S3 and S4. The first sensor pads S1 and S2 may have the length in the vertical direction of the semiconductor device that is longer than the length in the horizontal direction of the semiconductor device. The needles corresponding to first sensor pads S1 and S2 may have a progress direction starting from the top or bottom of the semiconductor device and directed toward the vertical center of the semiconductor device. The second sensor pads S3 and S4 may have the length in the horizontal direction of the semiconductor device that is longer than the length in the vertical direction of the semiconductor device. The needles corresponding to second sensor pads S3 and S4 may have a progress direction starting from the left or right of the semiconductor device and directed toward the horizontal center of the semiconductor device.

The pads of the semiconductor device, e.g. sensor pads and normal pads, arranged along the horizontal direction and the vertical direction of the semiconductor device and perpendicular thereto, may have different structures according to the progress direction of the corresponding needles of the testing apparatus. However, the scope of the exemplary embodiments is not limited thereto. For example, the semiconductor device according to another exemplary embodiment may include pads arranged in directions at various angles. An exemplary embodiment may include pads arranged in directions at various angles, and the corresponding needles may have progress directions along the various angles. As such, pads may have a different structure according to the progress direction of the corresponding needle of the testing apparatus.

Figure 2:
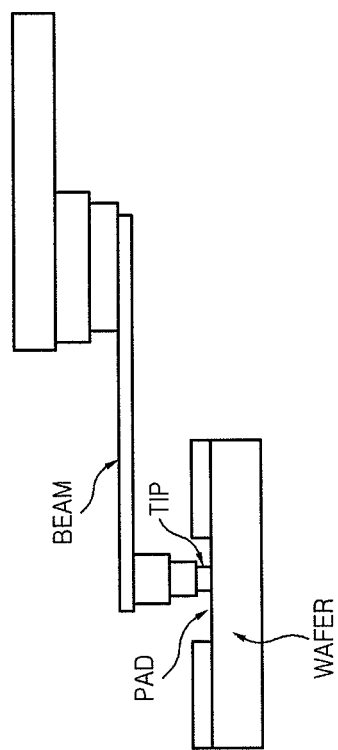
FIG. 2 illustrates the structure of an exemplary needle of the testing apparatus of FIG. 1 and a portion of a wafer that the needle contacts.
Figure 3:
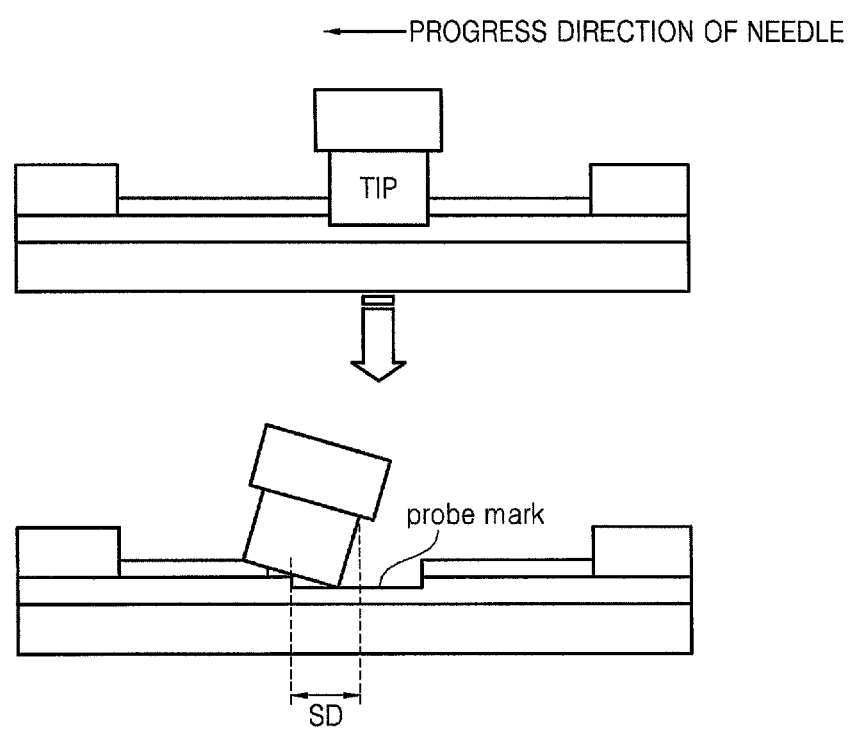
FIG. 3 illustrates a sliding phenomenon of the needle in the progress direction of the needle when the needle contacts the wafer.

FIG. 2 illustrates the structure of an exemplary embodiment of a needle of the testing apparatus of FIG. 1, and a portion of a wafer that the needle contacts. FIG. 3 illustrates a sliding phenomenon of the needle according to the progress direction of the needle when the needle contacts the wafer.

Referring to FIG. 2, the needle of the testing apparatus includes a tip contacting the pad of a wafer and a beam supporting the tip. Referring to FIG. 3, when the needle progresses from the right to the left of the pad of the wafer, the needle may slide a predetermined distance SD from a point where the needle starts to contact the pad. The semiconductor device according to an exemplary embodiment may include a plurality of pads having an increased length with respect to the progress direction of the corresponding needle in consideration, e.g., of the predetermined distance SD that the corresponding needle slides.

Figure 4:
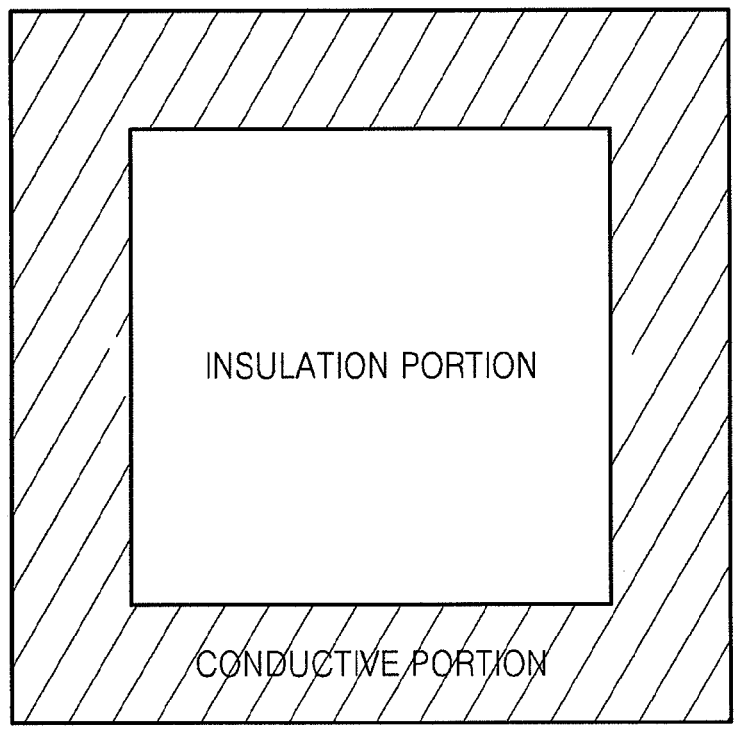
FIG. 4 illustrates an exemplary sensor pad.
Figure 5:
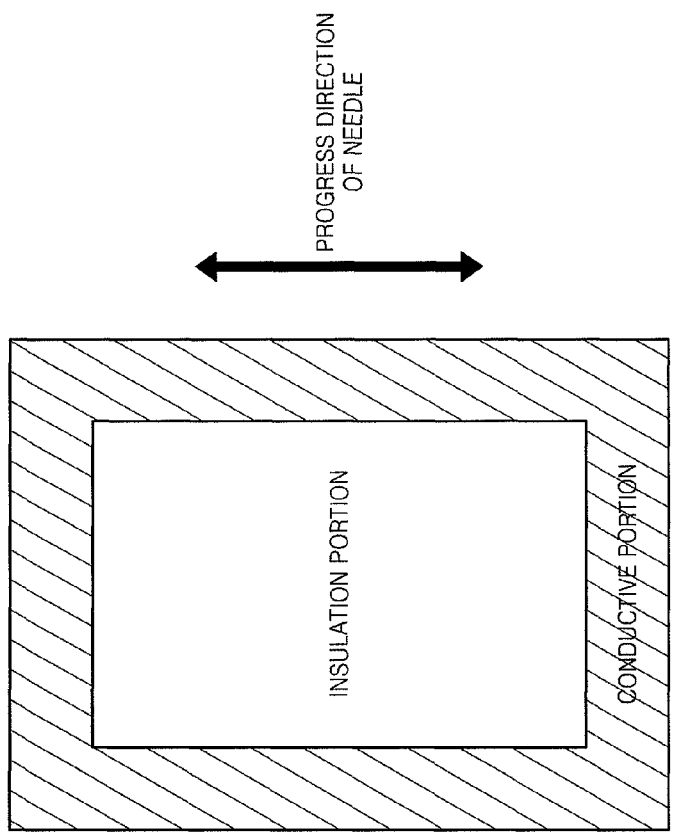
FIG. 5 illustrates a sensor pad corresponding to a needle that progresses in a vertical direction, according to an exemplary embodiment.

FIG. 4 illustrates a sensor pad having a square shape that does not consider the progress direction of the corresponding needle of the testing apparatus. FIG. 5 illustrates a sensor pad corresponding to a needle that progresses in a vertical direction, e.g., starting at the top or bottom of the semiconductor device along the y-axis, in a semiconductor device according to an exemplary embodiment. That is, the sensor pad of FIG. 5 has a structure based on, e.g., the first sensor pads S1 and S2, in which the length in the vertical direction is longer than the length in the horizontal direction.

Figure 6:
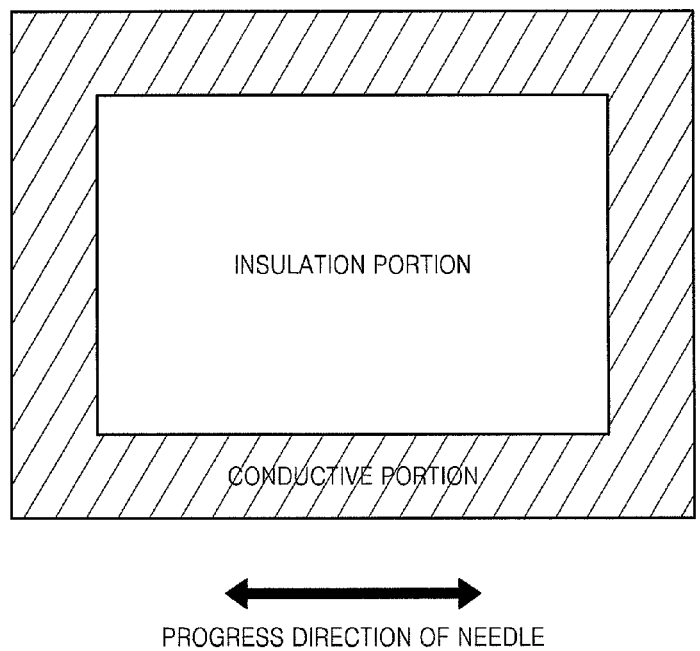
FIG. 6 illustrates a sensor pad corresponding to a needle that progresses in a horizontal direction, according to an exemplary embodiment.

FIG. 6 illustrates a sensor pad corresponding to a needle that progresses in a horizontal direction, e.g., start at the right or left of the semiconductor device along the x-axis, in a semiconductor device according to an exemplary embodiment. That is, the sensor pad of FIG. 6 has a structure based on, e.g., the second sensor pads S3 and S4, in which the length in the horizontal direction is longer than the length in the vertical direction.

As illustrated in FIGS. 4-6, the sensor pads may include an insulation portion arranged at a central portion and a conductive portion arranged at an edge portion of the sensor pad. The insulation portion of the sensor pads may be formed of an oxide having a high contact resistance. When the needle contacts the insulation portion, the electrical signal input through the needle may not be transferred to the semiconductor device. The conductive portion of the sensor pads may be formed of a conductive material such as a metal material. When the needle contacts the conductive portion, the electric signal input through the needle may be transferred to the semiconductor device.

Referring to FIGS. 5 and 6, the structure of the sensor pads of the semiconductor device may having a rectangular shape in which the length along the progress direction of the corresponding contacting needle is longer than the length in another progress direction, e.g., a direction perpendicular to the progress direction of the corresponding contacting needle. However, the scope of the exemplary embodiments is not limited thereto. For example, the sensor pads of the semiconductor device according to an exemplary embodiment may have another extended shape, e.g., an oval or a polygonal shape. The sensor pads having the extended shape may have a length in the progress direction of the corresponding contacting needle that is longer than a length in another progress direction, i.e., a different progress direction.

FIGS. 5 and 6 illustrate exemplary embodiments of a sensor pad, but the scope of the exemplary embodiments is not limited to sensor pads. For example, normal pads may have an extended shape, e.g., rectangular, oval, and polygonal, and may have a length in the progress direction of a corresponding needle that is longer than a length in another progress direction, i.e., a different progress direction.

At least one sensor pad may have a corresponding needle at an outermost side, e.g., the first and/or last needle in a row of needles, of a plurality of needles having a same progress direction, e.g., needles all having the same progress direction from the left of the semiconductor device toward the horizontal center of the semiconductor device. Referring to FIG. 1, Areas A1-A4 may include sensor pads having corresponding needles at an outermost side of a plurality of needles having a same progress direction. Without intending to be bound by this theory, the arrangement of the sensor pads at the outermost side portion corresponding to each of the progress directions of the needles may improve an efficiency of detecting a contact defect between the needle and the sensor pad, e.g., the edge portion of the sensor pad.

In the semiconductor device, e.g., having the H type pad arrangement structure of FIG. 1, the first sensor pads may include at least one sensor pad corresponding to the needle at the outermost side of the needles having the progress direction from the top to the bottom of the semiconductor device in Area A1 as shown in FIG. 1. The first sensor pads may include at least one sensor pad corresponding to the needle at the outermost side of the needles having the progress direction from the bottom to the top of the semiconductor device in Area A2 as shown in FIG. 1. Areas A1 and A2 may both include at least one sensor pad corresponding to needles at the outermost side of the plurality of needles having the same progress direction.

The second sensor pads of the semiconductor device may include at least one sensor pad corresponding to the needle at the outermost side of the needles having the progress direction from the left to the right of the semiconductor device in Area A3 as shown in FIG. 1. The second sensor pads may include at least one sensor pad corresponding to the needle at the outermost side of the needles having the progress direction from the right to the left of the semiconductor device in Area A4 as shown in FIG. 1. Areas A3 and A4 may both include at least one sensor pad corresponding to needles at the outermost side of the plurality of needles having the same progress direction.

For example, Areas A1 and A2 may include sensor pads having corresponding needles at an outermost side, e.g., respective left and right sides, of respective first and second plurality of needles extending along the y-axis. The first and second plurality of needles may have progress directions from the top and bottom, respectively, of the semiconductor device to the vertical center. In Area A1, e.g., the pad corresponding to the needle at the leftmost side may be a sensor pad. In Area A2, e.g., the pad corresponding to the needle at the rightmost side may be a sensor pad. Arranging the sensor pads along outermost sides of the needles, e.g, in diagonal directions or along each corner of the semiconductor device, may improve the accuracy in checking the needle alignment.

For example, Areas A3 and A4 may include sensor pads having corresponding needles at an outermost side, e.g., top and bottom sides, of respective third and fourth plurality of needles extending along the x-axis. The third and fourth plurality of needles may have progress directions from the left and right, respectively, of the semiconductor device to a horizontal center. In Area A3, e.g., the pad corresponding to the needle at the lowermost side may be a sensor pad. In Area A4, e.g., the pad corresponding to the needle at the uppermost side may be a sensor pad. Arranging the sensor pads along outermost sides of the needles, e.g., in diagonal directions or along each corner of the semiconductor device, may improve the accuracy in checking the needle alignment.

Figure 7:
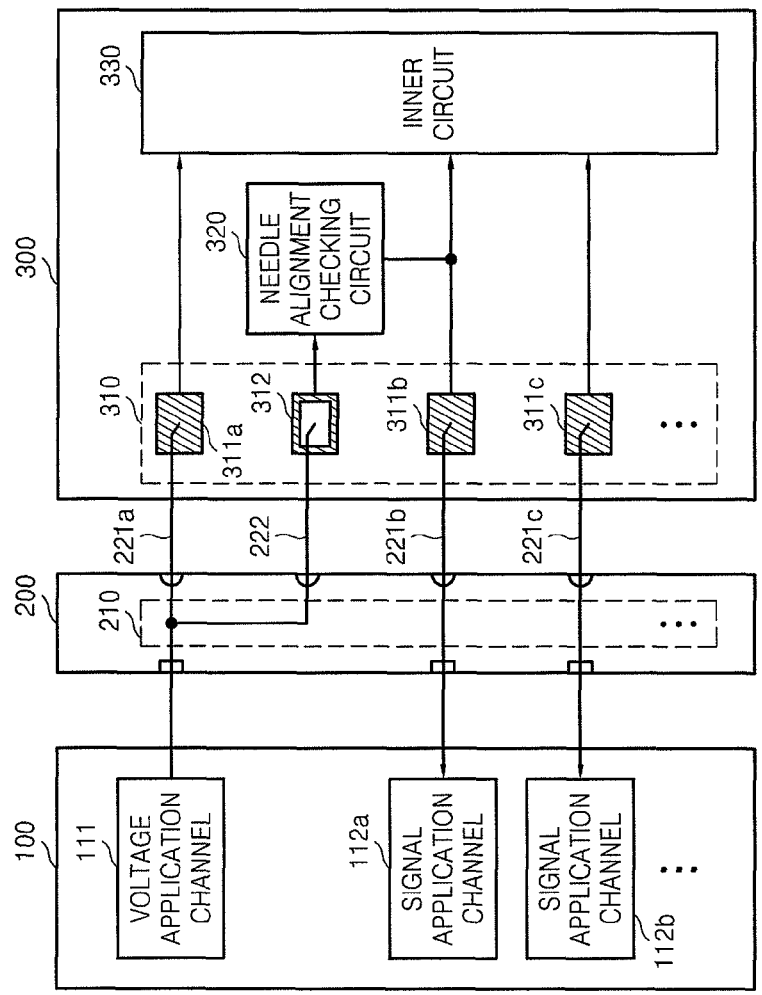
FIG. 7 illustrates an exemplary connection relationship between a semiconductor device and a testing apparatus, according to an exemplary embodiment.

FIG. 7 illustrates an interconnection between a semiconductor device 300 and testing apparatus 100 and 200 according to an exemplary embodiment. That is, FIG. 7 illustrates an exemplary needle alignment checking test for a semiconductor device, to which a needle alignment checking circuit 320 according to an exemplary embodiment may be applied. The testing apparatus may include the testing apparatus 100 for generating a predetermined test signal, or may include both the testing apparatus 100 and a probe card 200.

The probe card 200 may electrically connect the testing apparatus 100 for generating predetermined test signals and the semiconductor device 300. The testing apparatus 100 may include a voltage application channel 111 and a plurality of signal application channels, e.g., signal application channels 112a and 112b. A plurality of test signals, a power voltage, and a ground voltage, which may be generated by the voltage application channel 111 and the signal application channels 112a and 112b, may be provided to the semiconductor device 300 via the probe card 200.

The test signals and the voltages may be provided to the probe card 200 via corresponding channels. The test signals and the voltages provided to the probe card 200 may be provided to the semiconductor device 300 via a plurality of needles 221a, 221b, 221c, and 222 extending from the probe card 200. In the testing apparatus 100, a single signal, e.g., a single voltage, may be designed to occupy a single channel. The voltage provided by the testing apparatus 100 may be used as a probe signal.

For example, the probe signal used in the needle alignment checking circuit 320 may be a ground voltage. The ground voltage may function as the probe signal provided to determine an abnormal alignment state between probe needles 221a, 221b, 221c, and 222 and respective pads 311a, 311b, 311c, and 312. A separate channel may not be consumed to connect the testing apparatus 100 and the semiconductor device 300.

The probe card 200 may include an inner line 210 and the needles 221a, 221b, 221c, and 222. The voltage provided by the testing apparatus 100, e.g., functioning as a probe signal, may be provided to a normal pad 311a and a sensor pad 312 through the inner line 210 of the probe card 200. A plurality of test signals may be provided to the normal pads 311b and 311c via the inner line 210 of the probe card 200.

Figure 8:
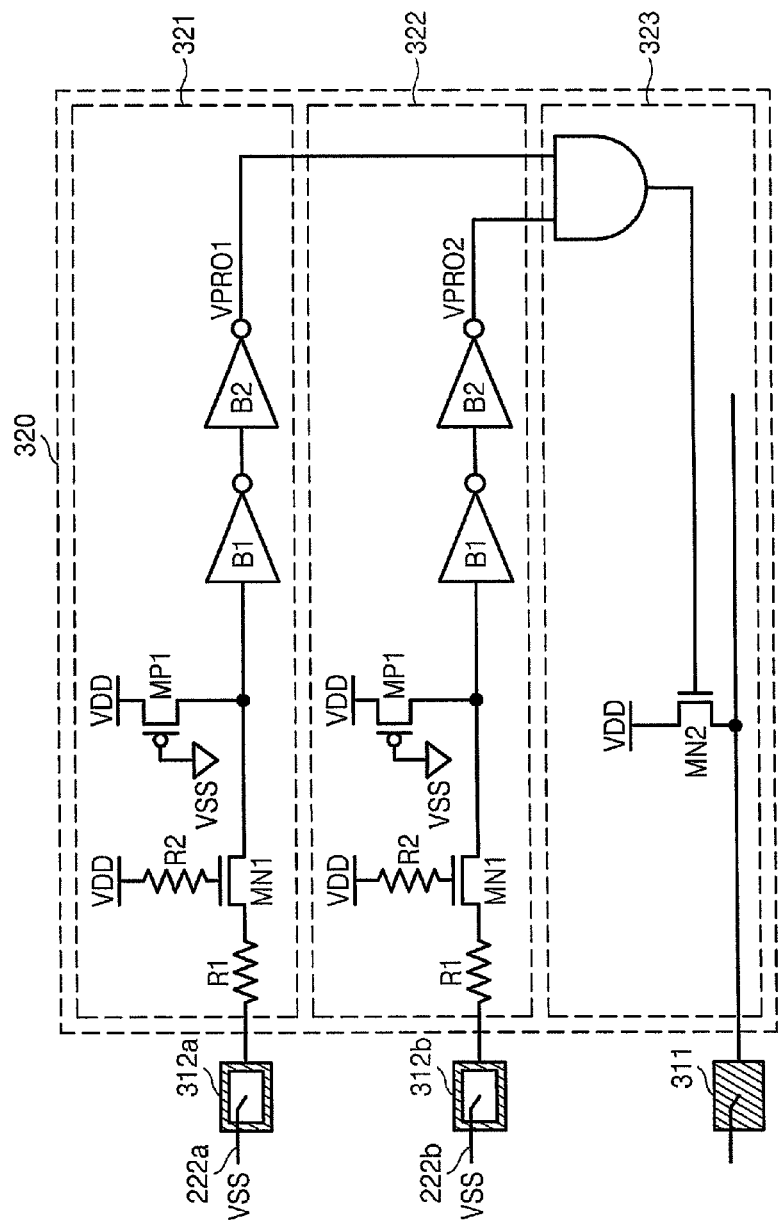
FIG. 8 illustrates an exemplary needle alignment checking circuit included in the semiconductor device and the testing apparatus of FIG. 7.

Referring to FIG. 7, the inner line 210 of the probe card 200 may transmit a voltage, e.g., a ground voltage VSS as illustrated in FIG. 8, and may be branched into two lines. However, the scope of the exemplary embodiments is not limited thereto. For example, the inner line 210 of the probe card 200 to transmit the voltage may be branched into three or more lines.

Referring to FIG. 7, the semiconductor device 300 may include a pad portion 310, the needle alignment checking circuit 320, and an inner circuit 330. The pad portion 310 may include the normal pads 311a, 311b, and 311c and the sensor pad 312 that provide and/or receive signals and voltages.

The needle alignment checking circuit 320 may determine whether the contact between the semiconductor device 300 and the testing apparatus 100 is defective based on probe results VPRO1 and VPRO2 generated based on the probe signal VSS received via at least two sensor pads. The needle alignment checking circuit 320 may output a determination as to whether the contact between the semiconductor device 300 and the testing apparatus 100 is defective to the testing apparatus 100 via a corresponding one of the normal pads 311a, 311b, and 311c.

FIG. 8 illustrates an exemplary embodiment of the needle alignment checking circuit 320 included in the semiconductor device 300 of FIG. 7. Referring to FIG. 8, the needle alignment checking circuit 320 may include two probe blocks 321 and 322 and an operation block 323.

The two probe blocks 321 and 322 may generate the respective probe results VPRO1 and VPRO2 indicating the contact defect between the needles 222a and 222b of the testing apparatus 100 and the respective sensor pads 312a and 312b. The probe results VPRO1 and VPRO2 may be based on the probe signal VSS received by the respective sensor pads 312a and 312b via the respective needles 222a and 222b. The operation block 323 may determine the contact defect between the semiconductor device 300 and the testing apparatus 100 based on a logical operation performed on the probe result, e.g., VPRO1 and/or VPRO2, received from the probe blocks 321 and 322. The operation block 323 may output the determination, i.e, results of the logical operation, to the corresponding normal pad 311.

In the operation of the needle alignment checking circuit 320, the sensor pads 312a and 312b may receive the probe signals VSS provided via the voltage channel of the testing apparatus 100. The probe results VPRO1 and VPRO2 may be generated in response to the probe signal VSS provided to the respective sensor pads 312a and 312b. In an exemplary embodiment, when the probe signal VSS is applied to the insulation portion of the sensor pad 312a, the probe result VPRO1 may be a logic high value. Accordingly, the needle alignment checking circuit 320 may detect that the needle 222a and the sensor pad 312a are correctly aligned. When the probe signal VSS is applied to the conductive portion of the sensor pad 312a, the probe result VPRO1 may be a logic low value. Accordingly, the needle alignment checking circuit 320 may detect that the needle 222a and the sensor pad 312a are not correctly aligned.

Referring to FIG. 8, in an exemplary embodiment, under the circumstance that the probe result VPRO1 is a logic high value, e.g., when the probe signal VSS is applied to the insulation portion of the sensor pad 312a, a transistor MN1 connected to the insulation portion of the sensor pad 312a via a resistor R1 may be turned off and transistor MP1 may be turned on in response to the ground voltage VSS. Thus, the probe result VPRO1 may have a logic high value by a power voltage VDD. The probe result VPRO1 may be buffered by a plurality of buffers, e.g., buffers B1 and B2.

Referring to FIG. 8, in an exemplary embodiment, under the circumstance that the probe result VPRO1 is a logic low value, e.g., when the probe signal VSS is applied to the conductive portion of the sensor pad 312a, the transistor MN1 connected to the conductive portion of the sensor pad 312a via the resistor R1 may be turned on in response to the power voltage VDD received via a resistor R2. Thus, the probe result VPRO1 has a logic low value by the power voltage VDD. The probe result VPRO1 may be buffered by the buffers B1 and B2. The above-discussed steps may be preformed on sensor pad 312b to generate the probe result VPRO2. As such, the operation of the probe block 321 may be applied to the probe block 322 in the same manner.

The operation block 323 of the needle alignment checking circuit 320 may perform an AND operation on the probe results VPRO1 and VPRO2 output from the respective probe blocks 321 and 322. The operation block 323 may provide an AND operation result to a gate of a transistor MN2.

In an exemplary embodiment, when the needle 222a and the sensor pad 312a are correctly aligned, the AND operation result may have a logic high value and the transistor MN2 may be turned on based on the AND operation result. Then, the logic high value based on the power voltage VDD may be output to the testing apparatus 100 via the normal pad 311. As a result, the testing apparatus 100 may apply various signals to the semiconductor device 300, e.g., to perform an EDS test. When the needle 222a and the sensor pad 312a are not correctly aligned, the AND operation result may have a logic low value and the transistor MN2 may be turned off based on the AND operation result. Then, the operation block 323 does not output a signal to the testing apparatus 100. As a result, the testing apparatus 100 may not apply the various signals to perform the EDS test to the semiconductor device 300.

In an exemplary embodiment, the AND operation result may have a logic high value and the transistor MN2 is turned on if both the needles 222a and 222b and the respective sensor pads 312a and 312b are correctly aligned. The AND operation result may have a logic low value and the transistor MN2 is turned off when one of the needles 222a and 222b and the respective sensor pads 312a and 312b are not correctly aligned.

Although the operation of the needle alignment checking circuit 320 is described with an example in which the probe results VPRO1 and VPRO2 of the two probe blocks 321 and 322 are input to the operation block 323, the scope of the exemplary embodiments is not limited thereto. For example, the needle alignment checking circuit 320 may include more than two probe blocks and two probe results. Further, the AND operation result may be based on the proper alignment of more than two needles and sensor pads or one needle and sensor pad.

Figure 9:
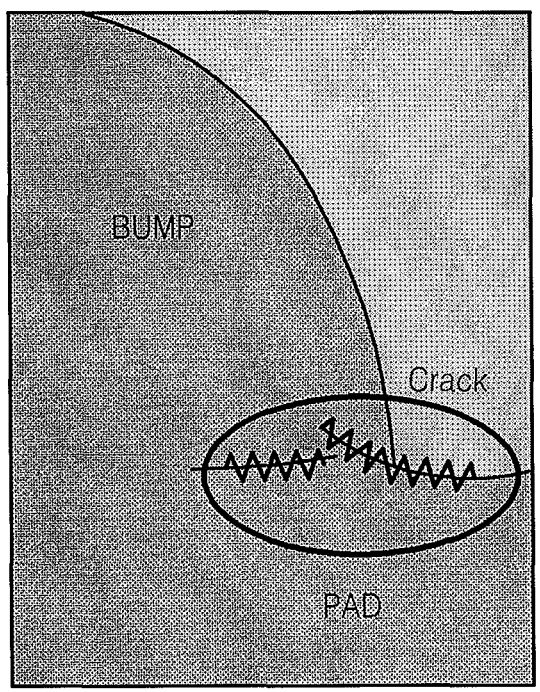
FIG. 9 illustrates a crack generated in a packaging process after a probing mark was generated during an EDS test process in a flip chip packaging process.

FIG. 9 illustrates an image showing an exemplary crack generated in a flip chip packaging process due to a probing mark generated in an EDS test process. The crack shown in FIG. 9 may be formed due to the probing mark being generated on the pad of the semiconductor device during the EDS test. The probing mark may be formed outside the arrangement area of a bump to be placed on the pad in a flip chip packaging process. The crack may deteriorate reliability of a semiconductor device after packing.

The probing mark may be a mark formed on the pads in the process in which the needles contact the pads. The flip chip packaging process may be a process in which circuits are electrically connected by a bump having a small protrusion, which may be different from using a wire bonding formed of a metal wire. The semiconductor device manufactured by the flip chip packaging process may consume less heat and electricity, and the device may have a fast signal speed. The flip chip packaging process may be mainly used for packaging a high performance semiconductor such as high speed CPUs or graphic cards.

Figure 10:
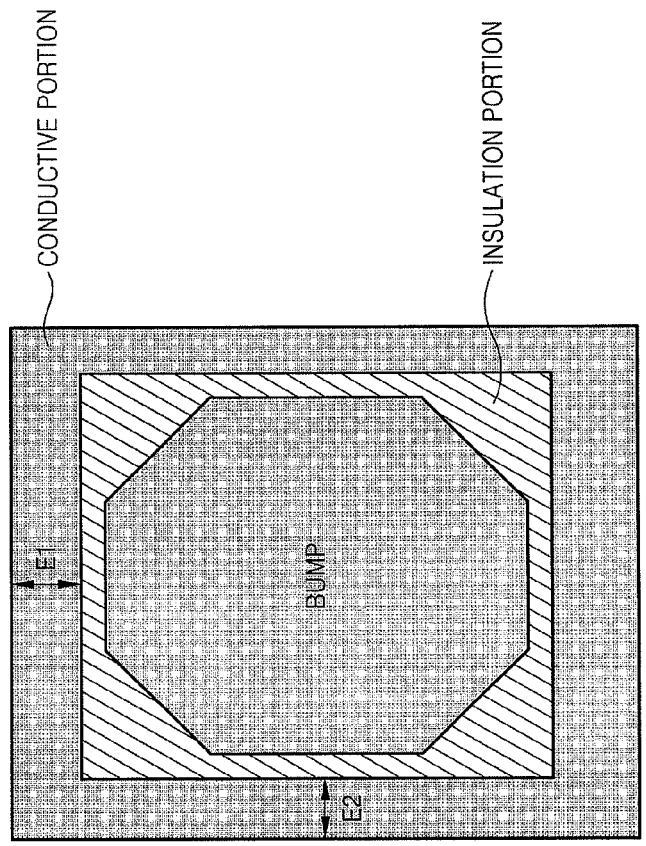
FIG. 10 illustrates an area where a bump according to a flip chip packaging process is arranged on a sensor pad of a semiconductor device, according to an exemplary embodiment.

FIG. 10 illustrates an area where a bump according to a flip chip packaging process may be arranged on a sensor pad of a semiconductor device according to an exemplary embodiment. Referring to FIG. 10, the bump may be arranged at the central portion of the sensor pad, e.g., inside the insulation portion.

The crack illustrated in FIG. 9 may be generated when the probing mark generated by the needle in the EDS test process is formed in the insulation portion of the sensor pad, but outside the area where the bump is to be arranged, e.g., in a hatched portion in the conductive portion of the sensor pad.

The probability of generating the crack in the semiconductor device after the EDS test may be decreased by increasing the widths E1 and E2 of the conductive portion surrounding the insulation portion of the sensor pad. For example, when the conductive portion of the sensor pad reaches the area where the bump is arranged, by increasing the widths E1 and E2 of the conductive portion of the sensor pad, the probability of crack generation in the semiconductor device after the EDS test may be decreased. However, there are limits to how much the widths E1 and E2 of the conductive portion of the sensor pad may be increased.

For example, during the EDS test process, if the probing mark is outside of the insulation portion of the sensor pad, the alignment of corresponding needle is determined to be incorrect so that the EDS test may not be performed. Accordingly, as the width of the conductive portion increases, the area of the insulation portion is decreased. As such, the area for proper alignment between the needle and the sensor pad of the semiconductor device may be limited to the area of the insulation portion. The generation area of the probing mark on the pads may also be decreased so that the probing marks may be limited to the decreased area of the insulation portion in which the generation area of the probing mark is decreased.

Figure 11:
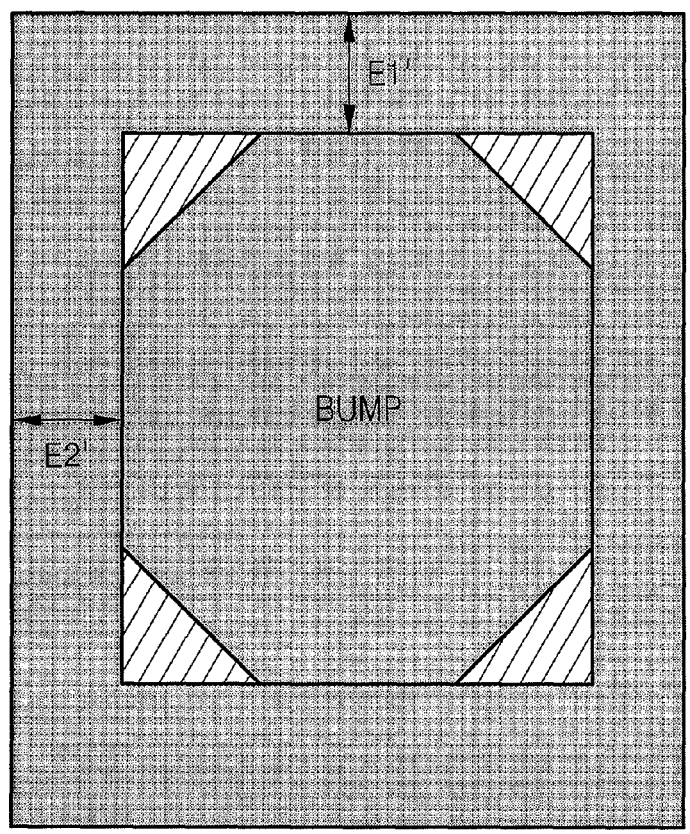
FIGS. 11 and 12 illustrate exemplary sensor pads of a semiconductor device having a modified structure considering the arrangement of a bump according to a flip chip packaging process, according to an exemplary embodiment.
Figure 12:
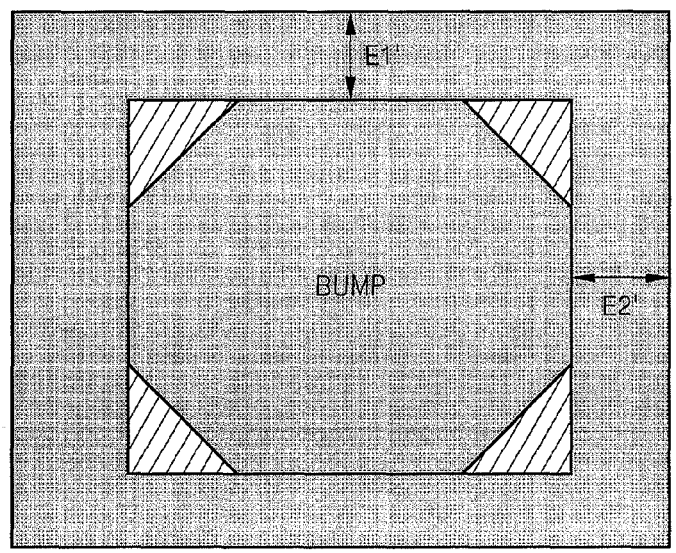

FIGS. 11 and 12 illustrate sensor pads of a semiconductor device according to an exemplary embodiment, which may have a modified structure that considers the arrangement of a bump for the flip chip packaging process. The widths E1' and E2' of the conductive portion of the sensor pads illustrated in FIGS. 11 and 12 may be wider than the widths E1 and E2 of the conductive portion of the sensor pad illustrated in FIG. 10. As such, the area, e.g., the hatched portion, where cracks may be generated in the sensor pad of FIGS. 11 and 12 may be narrower than the area where cracks may be generated in the sensor pad of FIG. 10.

For example, in the exemplary embodiment illustrated in FIGS. 11 and 12, the conductive portion of the sensor pads and the area where the bump may be arranged are in contact with each other. However, the conductive portion may include a portion of the area where the bump is arranged in the flip chip packaging process, which is arranged at the central portion of the sensor pad. For example, the insulation portion of the sensor pad includes the central portion of the area where the bump is arranged and the conductive portion includes a portion of the edge of the area where the bump is arranged. Thus, the probability of crack generation in the flip chip packaging process may be decreased. The probability of generation of a probing mark in a portion of the edge of the area where the bump is arranged, e.g., the conductive portion of the sensor pad, may be further decreased.

As described above, since the semiconductor device according to exemplary embodiments includes a plurality of sensor pads arranged at each of the edge areas considering the progress direction of the needle, an efficiency in checking the needle in the EDS test process may be improved and the deterioration of reliability in the packaging process due to the probing mark generated during the conductive EDS test process of the sensor pads may be prevented.

The attached drawings for illustrating exemplary embodiments are referred to in order to gain a sufficient understanding of the embodiments and the merits thereof. The embodiments are described in detail with reference to the attached drawings. Like reference numerals in the drawings denote like elements.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first signal could be termed a second signal, and, similarly, a second signal could be termed a first signal without departing from the teachings of the disclosure.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A semiconductor device having a plurality of pads, the semiconductor device comprising:
    a plurality of sensor pads configured to receive a probe signal from a testing apparatus; and
    a plurality of normal pads configured to receive a driving signal to drive the semiconductor device,
    wherein the plurality of sensor pads and the plurality of normal pads include individual sensor pads and normal pads that each have a length in a direction corresponding to one of progress directions of a plurality of needles of the testing apparatus that is longer than a length in another progress direction of the plurality of needles.

2. The semiconductor device as claimed in claim 1, wherein at least one sensor pad of the plurality of sensor pads corresponds to a needle at an outermost side of a plurality of needles having a same progress direction.

3. The semiconductor device as claimed in claim 1, wherein the plurality of sensor pads includes:
    first sensor pads having a length in a vertical direction of the semiconductor device that is longer than a length in a horizontal direction of the semiconductor device, the first sensor pads corresponding to needles having progress directions from a top or a bottom of the semiconductor device toward the vertical center of the semiconductor device; and second sensor pads having a length in the horizontal direction of the semiconductor device that is longer than a length in the vertical direction of the semiconductor device, the second sensor pads corresponding to needles having progress directions from a left or a right of the semiconductor device toward the horizontal center of the semiconductor device.

4. The semiconductor device as claimed in claim 3, wherein the first sensor pads include:
   at least one sensor pad corresponding to a needle at an outermost side of the plurality of needles having progress directions from the top of the semiconductor device toward the vertical center of the semiconductor device; and
   at least one sensor pad corresponding to a needle at an outermost side of the plurality of needles having progress directions from the bottom of the semiconductor device toward the vertical center of the semiconductor device.

5. The semiconductor device as claimed in claim 3, wherein the second sensor pads include:
   at least one sensor pad corresponding to a needle at an outermost side of the plurality of needles having progress directions from the left of the semiconductor device toward the horizontal center of the semiconductor device; and
   at least one sensor pad corresponding to a needle at an outermost side of the plurality of needles having progress directions from the right of the semiconductor device toward the horizontal center of the semiconductor device.

6. The semiconductor device as claimed in claim 3, wherein each sensor pad includes:
   an insulation portion arranged at a central portion of the sensor pad; and
   a conductive portion arranged at an edge portion of the sensor pad.

7. The semiconductor device as claimed in claim 6, wherein the conductive portion includes a part of an area where a bump of a flip chip process is arranged.

8. The semiconductor device as claimed in claim 7, wherein:
   the insulation portion includes a central part of the area where the bump of the flip chip process is arranged; and
   the conductive portion includes an edge part of the area where the bump of the flip chip process is arranged.

9. The semiconductor device as claimed in claim 3, further comprising a needle alignment checking circuit configured to detect a contact defect between the semiconductor device and the testing apparatus based on a result of a probe signal received via at least two sensor pads, the needle alignment checking circuit configured to output the contact defect to the testing apparatus via a corresponding one of the plurality of normal pads.

10. The semiconductor device as claimed in claim 9, wherein the needle alignment checking circuit includes:
    at least two probe blocks, each configured to generate a probe result indicating the contact defect between the needles of the testing apparatus and the corresponding sensor pads based on the probe signal received by the sensor pads via the needles of the testing apparatus; and
    an operation block configured to determine the contact defect between the semiconductor device and the testing apparatus based on a logical operation on the probe result received from each of the at least two probe blocks, the operation block configured to output a determination to the corresponding normal pads.

11. A method of performing a needle alignment check on a wafer, comprising:
    providing a probe signal from a testing apparatus to a plurality of sensor pads on the wafer; and
    providing a signal for the testing apparatus to a plurality of normal pads on the wafer,
    wherein the plurality of sensor pads and the plurality of normal pads include sensor pads and normal pads that each have a length in a direction corresponding to one of progress directions of a plurality of needles of the testing apparatus that is longer than a length in another progress direction of the plurality of needles.

12. The method as claimed in claim 11,
    detecting a contact defect between the wafer and the testing apparatus based on a result of a probe signal received via at least two sensor pads; and
    outputting the contact defect to the testing apparatus via a corresponding one of the plurality of normal pads.

13. The method as claimed in claim 12, further comprising:
    generating a probe result indicating the contact defect between the needles of the testing apparatus and the corresponding sensor pads, based on the probe signal received by the sensor pads via the needles of the testing apparatus; and
    determining the contact defect between the wafer and the testing apparatus based on a logical operation on the probe result received from each of at least two probe blocks and outputting a determination to the corresponding normal pads.

* * * * *